(12) United States Patent
Nesbitt et al.

(10) Patent No.: US 8,362,357 B2
(45) Date of Patent: Jan. 29, 2013

(54) ENVIRONMENTALLY-FRIENDLY COATINGS AND ENVIRONMENTALLY-FRIENDLY SYSTEMS AND METHODS FOR GENERATING ENERGY

(76) Inventors: Jeffrey E. Nesbitt, Lititz, PA (US); Robert A. Harris, Akron, OH (US)

( * ) Notice: Subject to any disclaimer, the term of this patent is extended or adjusted under 35 U.S.C. 154(b) by 532 days.

(21) Appl. No.: 12/625,227

(22) Filed: Nov. 24, 2009

(65) Prior Publication Data
US 2011/0120546 A1 May 26, 2011

(51) Int. Cl.
*H01L 31/0216* (2006.01)
*C08K 3/34* (2006.01)

(52) U.S. Cl. .......... 136/256; 136/251; 136/259; 522/90; 522/96; 524/445; 523/135

(58) Field of Classification Search .......... 136/256, 136/251, 259; 522/90, 96; 524/445; 523/135
See application file for complete search history.

(56) References Cited

U.S. PATENT DOCUMENTS

| | | | |
|---|---|---|---|
| 4,383,129 A | 5/1983 | Gupta et al. | |
| 4,549,033 A | 10/1985 | Avenel et al. | |
| 4,953,577 A | 9/1990 | Marshall | |
| 5,106,891 A | 4/1992 | Valet | |
| 5,507,880 A | 4/1996 | Ishikawa et al. | |
| 6,653,394 B1 * | 11/2003 | Meisenburg et al. | 524/589 |
| 2007/0256727 A1 | 11/2007 | Gumm | |
| 2007/0259103 A1 | 11/2007 | Gumm | |
| 2009/0188559 A1 | 7/2009 | Nesbitt | |

FOREIGN PATENT DOCUMENTS

| | | |
|---|---|---|
| FR | 2896445 A1 | 1/2006 |
| WO | 2007131114 A3 | 11/2007 |
| WO | 2008014492 A2 | 1/2008 |
| WO | 2009016388 A1 | 2/2009 |

OTHER PUBLICATIONS

Evonik Industries, ROHAGLAS Film Clear 0F016, product information, Mar. 2006, 2 pages.
DuPont Tedlar, Flexible Product Adhesives for Use with DuPont Tedlar Polyvinyl Fluoride Film, Mar. 2009, 2 pages.
Esacure by Lamberti, Esacure KIP 100 F, 1 page.
Ciba Specialty Chemicals, Inc. Coating Effects Segment, Ciba TINUVIN 400, Mar. 29, 2001, 3 pages.
Ciba Specialty Chemicals, Inc., Coating Effects Segment, Ciba TINUVIN 292, Jan. 20, 2005, 3 pages.
Sartomer Company, Inc., Product Bulletin: SR238B, 1,6 Hexanediol Diacrylate, Jul. 2007, 1 page.
Sartomer Company, Inc., Technical Data Sheet: CN9001, Aliphatic Urethane Acrylate Oligomer, Jul. 2009, 1 page.
Southern Clay Products, Inc., a subsidiary of Rockwood Specialities, Inc., Product Bulletin/Cloisite, Cloisite 30B, 2 pages.

* cited by examiner

*Primary Examiner* — Vu A Nguyen
(74) *Attorney, Agent, or Firm* — McNees Wallace & Nurick LLC

(57) ABSTRACT

UV-curable coatings for photovoltaic systems, photovoltaic systems having a UV-curable coating, and methods of generating energy through photovoltaic systems having a UV-curable coating are disclosed. The UV-curable coating includes a urethane acrylate blend, a montmorillonite platelet, a light stabilizer, a UV absorber, and a photoinitiator. The coating is substantially transparent to visible and near infrared light and provides a barrier to oxygen and moisture and the coating is configured to adhere to an acrylic film.

20 Claims, 2 Drawing Sheets

ENVIRONMENTALLY-FRIENDLY COATINGS AND ENVIRONMENTALLY-FRIENDLY SYSTEMS AND METHODS FOR GENERATING ENERGY

FIELD OF THE INVENTION

The present disclosure generally relates to environmentally-friendly coatings and environmentally-friendly systems and methods for generating energy. More specifically, the present disclosure relates to UV-curable coatings for photovoltaic systems, photovoltaic systems having a UV-curable coating, and methods of generating energy through photovoltaic systems having a UV-curable coating.

BACKGROUND OF THE INVENTION

Energy demand is constantly increasing. As the energy demand increases, sources alternative to fossil fuel energy sources increase in importance. One such alternative energy source is solar energy. Generally, solar energy is produced by converting radiation (for example, sunlight) into electricity which may be stored or transmitted through electrical power grids.

Fossil fuel energy sources (for example, oil, natural gas, and coal) can produce energy through numerous known processes (for example, combustion). The known processes may be inexpensive but may harm the environment by generating harmful emissions.

Some systems for generating energy include coatings to protect the system. Manufacturing such systems may also harm the environment. For example, solvent-based coatings formed by solvents being released into the atmosphere can harm the environment. Also, solvent-based manufacturing processes may include long process lines, requiring substantial investment capital, space, maintenance, and energy.

BRIEF DESCRIPTION OF THE INVENTION

In an exemplary embodiment, a photovoltaic system includes an acrylic film coated with a UV-curable coating, a photovoltaic device, and a securing mechanism securing the acrylic film to the photovoltaic device. The UV-curable coating includes a urethane acrylate blend, a montmorillonite platelet, a light stabilizer, a UV absorber, and a photoinitiator. Also, the coating is substantially transparent to visible and near infrared light, provides a barrier to oxygen and moisture, and adheres to an acrylic film.

In another exemplary embodiment, a method of generating energy through photovoltaics includes providing a photovoltaic system, positioning the photovoltaic system to receive solar radiation, and converting the solar radiation into electrical energy. The photovoltaic system includes an acrylic film coated with a UV-curable coating, a photovoltaic device, and a securing mechanism securing the acrylic film to the photovoltaic device. The coating includes a urethane acrylate blend, a montmorillonite platelet, a light stabilizer, a UV absorber, and a photoinitiator. Also, the coating is substantially transparent to visible and near infrared light, provides a barrier to oxygen and moisture, and adheres to an acrylic film.

In another exemplary embodiment, an UV-curable coating for photovoltaics includes a urethane acrylate blend, a montmorillonite platelet, a light stabilizer, a UV absorber, and a photoinitiator. In the embodiment, the coating is substantially transparent to visible and near infrared light, provides a barrier to oxygen and moisture, and adheres to an acrylic film.

BRIEF DESCRIPTION OF THE DRAWINGS

Wherever possible, the same reference numbers will be used throughout the drawings to represent the same parts.

DETAILED DESCRIPTION OF THE INVENTION

Provided is an environmentally-friendly coating and an environmentally-friendly system and method for generating energy. The environmentally-friendly coating is a UV-curable coating for a photovoltaic system. The environmentally-friendly system for generating energy is the photovoltaic system including the UV-curable coating. The environmentally-friendly method for generating energy is a method of generating energy with the photovoltaic system including the UV-curable coating. The UV-curable coating may reduce or eliminate deterioration of photovoltaic cells over time, thereby improving systems and methods for generating energy with photovoltaic systems.

A UV coating system for applying and curing the UV-curable coating may be smaller in size than a solvent-based or heat-based system, may rely upon lower amounts of energy than a solvent-based or heat-based system, may cure in less than a second as opposed to the minutes or hours of a solvent-based or heat-based system, and/or may result in less waste than a solvent-based or heat-based system.

Exemplary embodiments of the UV-curable coating may be transparent to visible and near infrared light, may absorb or block UV light, may have long term durability, may retain transparency for extended periods of time (for example, beyond 20 years), may be water washable by natural precipitation or natural rain fall, may shed atmospheric pollutants and other debris easily, may be laminated to solar cell arrays, may be resistant to color change, haze, or other changes affecting light transmission, and/or may provide a barrier to oxygen and moisture.

Figure 1:
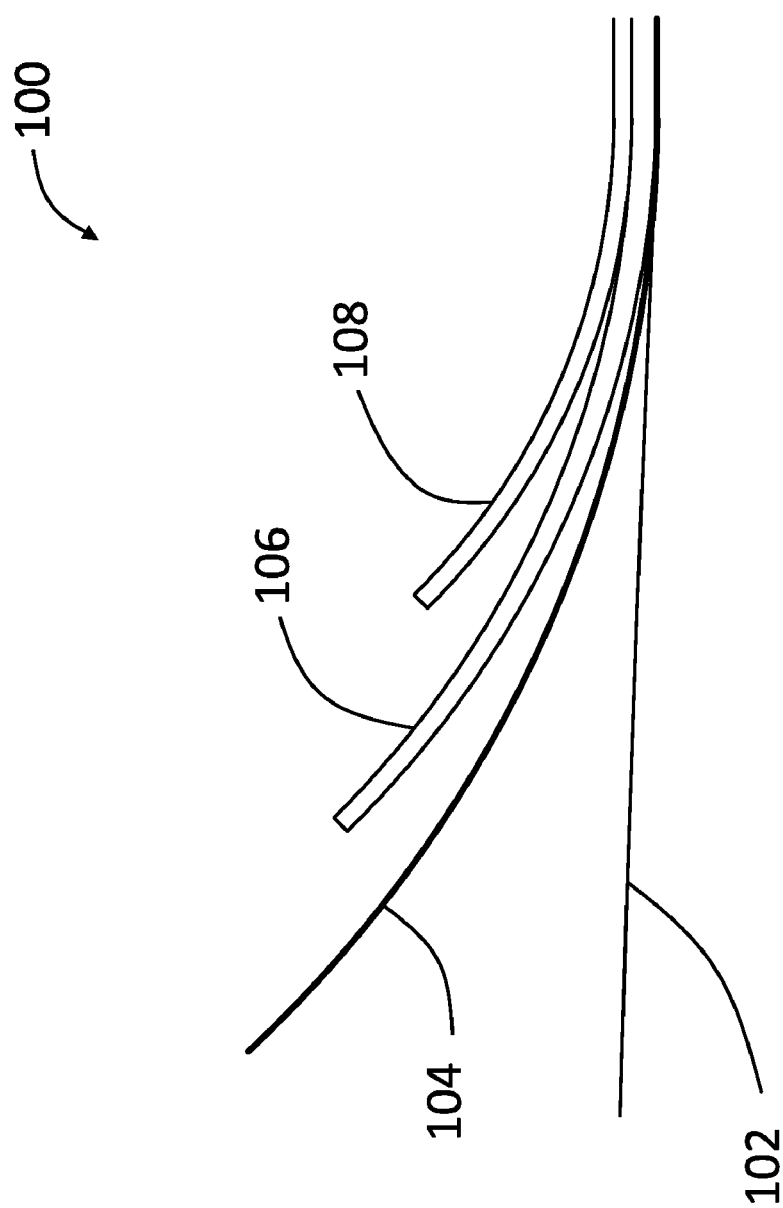
FIG. 1 shows an exemplary photovoltaic system according to the disclosure.

Referring to FIG. 1, an exemplary photovoltaic system 100 includes a photovoltaic device 102, an optically transparent adhesive 104, an acrylic film 106, and a UV-curable coating 108. As used herein, the term "UV-curable coating" refers to a coating curable by ultraviolet radiation at one or more predetermined wavelengths. Use of the UV-curable coating can reduce or eliminate the use of solvents, thereby reducing or eliminating the emission of volatile organic compounds (VOCs), which can harm the environment. Thus, the cost of solvents and/or solvent recovery systems may be reduced or eliminated. As used herein, the term "solar radiation" refers to radiation from the sun. Solar radiation may include radiation with a wavelength from about 100 nanometers to about 1 millimeter, a range of about 100 to about 280 nanometers being UV-C and being applicable to photovoltaic devices 102 positioned in space or not otherwise protected by the Earth's atmosphere, a range of about 280 to 315 nanometers being UV-B and also being applicable to photovoltaic devices 102 positioned in space or not otherwise protected by the Earth's atmosphere, a range of about 315 to 400 nanometers being UV-A and being applicable to photovoltaic devices 102 positioned in space and/or positioned on Earth, a range of about 400 to 700 nanometers being the visible range and being applicable to photovoltaic devices 102 positioned in space and/or positioned on Earth, and a range of about 700 nanometers to 1 millimeter being infrared (with near infrared or IR-A being a range of about 700 nanometers to 1400 nanometers, IR-B being a range of about 1400 nanometers to about 3000 nanometers, and far infrared or IR-C being a range of about 3000 nanometers to 1 millimeter) and being applicable to photovoltaic devices positioned in space and/or positioned on Earth.

Photovoltaic system 100 converts solar radiation into electricity. Photovoltaic system 100 may be a thin film system or any other suitable photovoltaic system(s). Photovoltaic system 100 may include any type of photovoltaic device 102 with one or more layers covering, partially covering, and/or encapsulating photovoltaic device 102. In an exemplary embodiment, photovoltaic device 102 may be a photovoltaic cell. Photovoltaic device 102 may convert solar radiation of a predetermined wavelength directly into electricity. For example, photovoltaic device 102 may include fluorescent concentrators oriented toward the sun in a polymer sheet secured to a material that fluoresces when excited by radiation of the predetermined wavelength. Photovoltaic device 102 may be polymer-based and/or organic, may include polymer blends, and/or may include mixtures of conjugated polymers with nano-particles and/or nano-crystals of inorganic semiconductors. Photovoltaic device 102 may include a semiconductor material including silicon, cadmium sulfide, cadmium telluride, gallium arsenide, and/or other suitable semiconductor materials. The semi-conductor material may be in single crystalline, multi-crystalline, and/or amorphous forms.

Acrylic film 106 may be any suitable weather resistant film capable of resisting deterioration due to solar radiation. In an exemplary embodiment, acrylic film 106 may be polymethylmethacrylate with a polybutylacrylat elastomer. Acrylic film 106 may have a pencil hardness of about 1H measured in accordance with the test method of ASTM D3363. Acrylic film 106 may have a softening temperature of about 96° C. (205° F.) and/or a specific heat of about 1.5 kJ/kg×K. Acrylic film 106 may have optical transmission of about 92% and UV-transmission ($T_{280-380\ nm}$) of less than or equal to about 1.5% both measured in accordance with test method of DIN 5036. Acrylic film 106 may have a yellowness index of less than or equal to about 1.5% measured in accordance with the test method of ASTM D1925. Acrylic film 106 may have a haze of about 1% measured in accordance with the test method of ISO 489. Acrylic film 106 may have a density of about 1.16 g/cm$^3$. In one embodiment, the predetermined application thickness of acrylic film 106 may be a range from about 0.0005 inches (0.5 mils) (13 microns) to about 6.0 mils (152 microns). In a further embodiment, the range may be from about 2.0 mils (51 microns) to about 6.0 mils (152 microns). In a further embodiment, the application thickness may be about 3.0 mils (76 microns).

Figure 2:
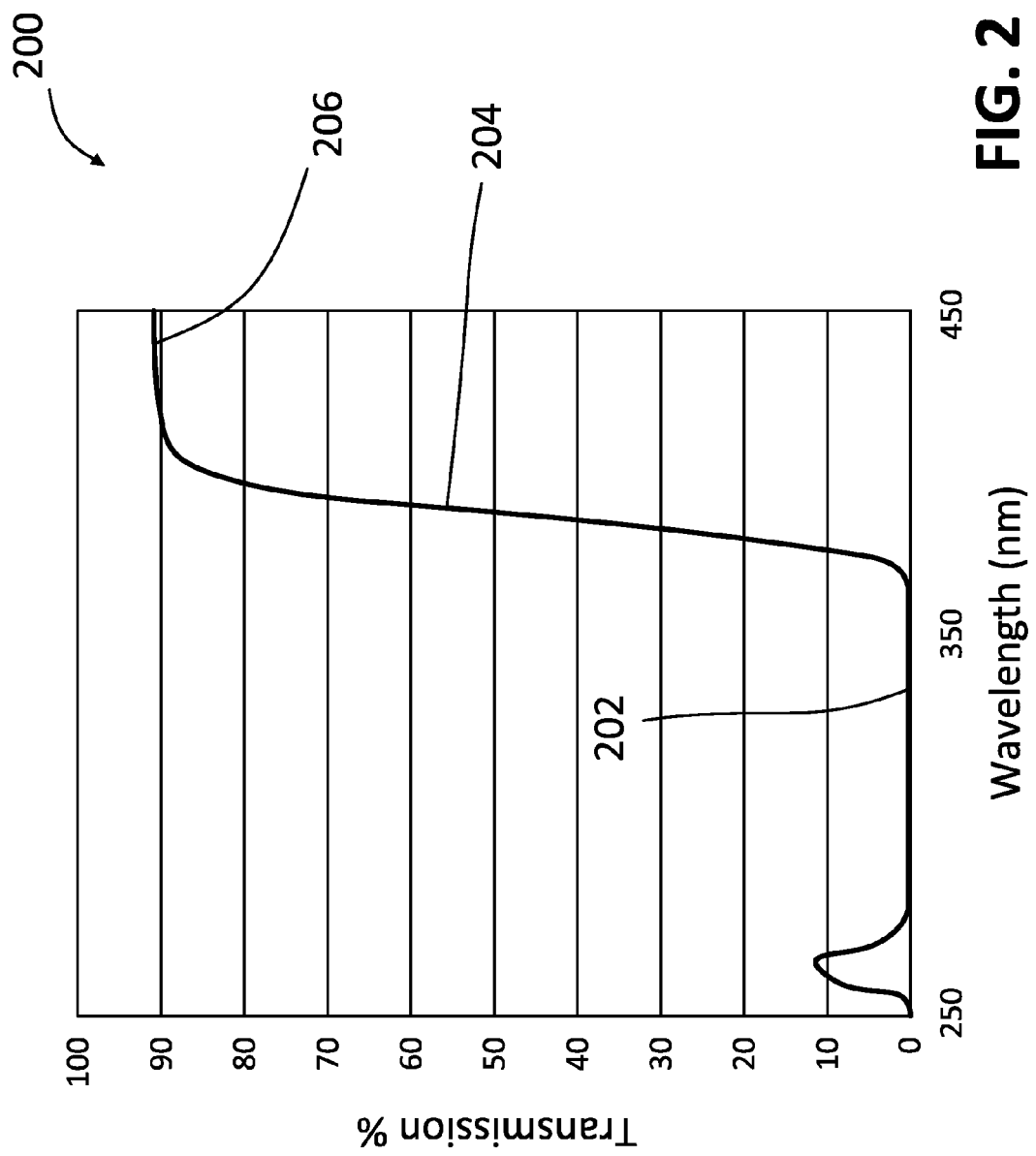
FIG. 2 shows a transmission versus wavelength plot for an exemplary acrylic film according to the disclosure.

Referring to FIG. 2, at the predetermined application thickness (for example about 3.0 mils), acrylic film 106 may have a transmission versus wavelength plot 200 including a low transmission region 202, an increasing transmission region 204, and a high transmission region 206. In one embodiment, increasing transmission region 204 may include the wavelengths of radiation required for curing UV-curable coating 108. For example, increasing transmission region 204 may extend from about 370 nanometers to about 430 nanometers and may include one or more activation wavelengths for one or more predetermined photoinitiators.

Referring again to FIG. 1, acrylic film 106 may be secured to photovoltaic device 102 by any suitable temporary or permanent securing mechanism permitting transmission of the predetermined wavelength of solar radiation that can be converted into electricity by photovoltaic device 102. Securing of acrylic film 106 to photovoltaic device 102 may be performed prior to or subsequent to applying UV-curable coating 108 to acrylic film 106. In an exemplary embodiment, an optically pure (or substantially pure) adhesive 104 may be applied to photovoltaic device 102 and/or acrylic film 106 to secure acrylic film 106 to photovoltaic device 102. For example, a liquid acrylic adhesive such as Dupont Tedlar® 68080, available from E.I. du Pont de Nemours and Company, may be used. In one embodiment, a predetermined thickness of adhesive 104 may be applied in a range from about 0.25 mils (83 microns) to about 1.75 mils (44 microns). In a further embodiment, the range may be from about 0.5 mils (13 microns) to about 1.5 mils (38 microns). In a further embodiment, the thickness may be about 1.0 mils (25 microns). Another suitable securing mechanism may include partially curing or B-stage curing UV-curable coating 108 applied to a side of acrylic film 106 proximal to photovoltaic device 102. Then, the coated film is positioned and further cured on photovoltaic device 102. Other suitable securing mechanisms may include applying pre-treatments to the photovoltaic device 102 and/or acrylic film 106 for improved adhesion (for example, silane-based pretreatments). Additionally or alternatively, acrylic film 106 may be further secured to photovoltaic device 102 by static or suitable other physical properties. Additionally or alternatively, acrylic film 106 may be further secured to photovoltaic device 102 by any suitable fasteners.

UV-curable coating 108 can be a urethane/acrylic coating having a viscosity corresponding to a preselected application process. For example, UV-curable coating 108 may have a relatively low viscosity corresponding to spray and/or vacuum coating application processes or a relatively high viscosity corresponding to roll coating, curtain coating process, and/or dip coating. UV-curable coating 108 may have a predetermined viscosity corresponding to other suitable coating application processes. Viscosity of UV-curable coating 108 may be adjusted by modifying the temperature of UV-curable coating 108 and/or by modifying the concentration of components of the formula of UV-curable coating 108. For example, in a formula including urethane diacrylate oligomer, the concentration of other acrylic resins as well as monomers (such as dipropylenegylcol diacrylate and/or tripropylene glycol diacrylate) may be increased or decreased thereby increasing or decreasing the viscosity.

The viscosity and/or the preselected application process of UV-curable coating 108 may correspond to a predetermined application thickness. For example, a viscosity between about 200 centipoise and 3000 centipoise may correspond to a desired predetermined application thickness. In one embodiment, the predetermined application thickness of UV-curable coating 108 may be a range of thicknesses from about 0.5 mils (13 microns) to about 6.0 mils (152 microns). In a further embodiment, the range may be from about 2.0 mils (51 microns) to about 4.0 mils (102 microns). In a further embodiment, the thickness may be about 3.0 mils (76 microns). One or more layers may form UV-curable coating 108. For example, a wear layer and a top coat layer may be applied to form UV-curable coating 108. The wear layer and the top coat layer may be identical or may differ in formulation and/or application temperature. In one embodiment, a wear layer may be applied to acrylic film 106 and partially cured (B-stage cured) with the top coat layer subsequently being applied to the wear layer. Then, the wear layer can be further cured and the top coat layer can be cured. Such B-stage curing may permit multiple UV-curable coatings 108 (each having multiple layers) to be applied to acrylic film 106 while maintaining adhesion.

In one embodiment, UV-curable coating 108 may be applied to both sides of acrylic film 106. The application of UV-curable coating 108 to both sides of acrylic film 106 may increase the tortuous nature of any path through UV-curable coatings 108 and acrylic film 106. For example, application of UV-curable coating 108 to acrylic film 106 forms an interface between UV-curable coating 108 and acrylic film 106. The interface may act as a partial moisture and oxygen barrier. Application of UV-curable coating 108 to each side of acrylic film 106 thus forms two interfaces. In a further embodiment, UV-curable coating 108 may be applied to one or more side of acrylic film 106 by B-stage curing. By applying UV-curable coating 108 through B-stage curing to one side and applying an additional layer of UV-curable coating 108 to the B-stage cured layer, an interface is formed between the B-stage cured UV-curable coating 108 and the other UV-curable coating 108. Thus, applying B-stage cured UV-curable coating 108 to acrylic film 106 and applying UV-curable coating 108 to B-stage cured UV-curable coating 108 may form two interfaces. In one embodiment, B-stage cured UV-curable coating 108 is applied to both sides of acrylic film 106, the acrylic film 106 is applied to a photovoltaic device, and UV-curable coating 108 is applied to the exposed B-stage cured UV-curable coating 108. In the embodiment, four interfaces are formed (between the bottom B-stage cured layer, the acrylic layer, the top B-stage cured layer, and the top coat layer).

In an exemplary embodiment, UV-curable coating 108 includes a urethane acrylate blend, a montmorillonite platelet, a light stabilizer, a UV absorber, and a photoinitiator. UV-curable coating 108 is transparent to one or more predetermined wavelength ranges (for example, visible and near infrared light) and provides a barrier to oxygen and moisture.

The urethane acrylate blend of UV-curable coating 108 may be aliphatic urethane acrylate oligomer and 1,6 hexanediol diacrylate. The amount of the blend included in UV-curable coating 108 may be based upon a predetermined amount for providing the desired viscosity and/or for dissolving other components of UV-curable coating 108. In an exemplary embodiment, the blend may form about 87% (by weight) to about 93% of the uncured UV-curable coating 108. In a further embodiment, the blend may form about 89% to about 91% of the uncured UV-curable coating 108. In a further embodiment, the blend may form about 91% of the uncured UV-curable coating 108.

The aliphatic urethane acrylate oligomer may provide adhesion, weatherability, chemical resistance, flexibility, heat resistance, and/or water resistance. An exemplary aliphatic urethane acrylate oligomer may be a clear liquid having a specific gravity of about 1.0007, a density of about 8.40 lb/gal, a refractive index of about 1.4971, a $T_g$ of about 60 degrees C., and a viscosity of about 46,500 cps., available from Sartomer Company, Inc. Additionally or alternatively, other suitable oligomers may be used.

The 1,6 hexanediol diacrylate may provide weatherability, chemical and water resistance, adhesion, hardness and abrasion resistance, heat resistance, and increased cure response. An exemplary 1,6 hexanediol diacrylate may be a clear liquid having a specific gravity of about 1.020 at 25° C., a viscosity of about 9 cps at 25° C., a refractive index of about 1.4560, a surface tension of about 35.7 dynes/cm, a $T_g$ of about 43 degrees C., and a molecular weight of about 226, available from Sartomer Company, Inc. Additionally or alternatively, other suitable functional monomers configured for polymers and as crosslinking agents between molecular chains of polymers may be used.

The montmorillonite platelet of UV-curable coating 108 may be clay modified with a quaternary ammonium salt. The montmorillonite platelet may provide reinforcement, increased heat distortion resistance, decreased coefficient of linear thermal expansion, and/or prevent moisture/oxygen permeability. Generally, unrefined montmorillonite platelet is a clay having two tetrahedral sheets positioned around a central octahedral sheet. In other embodiments, other suitable additives having a similar geometry may be used. Unrefined, the particles may be plate-shaped with an average diameter of approximately one micrometer. In other embodiments, other suitable additives having a similar diameter may be used. In an exemplary embodiment, the montmorillonite platelet may form about 3.0% (by weight) to about 7.0% of the uncured UV-curable coating 108. In a further embodiment, the montmorillonite platelet may form about 4.0% to about 6.0% of the uncured UV-curable coating 108. In a further embodiment, the montmorillonite platelet may form about 5.0% of the uncured UV-curable coating 108. In one embodiment, the montmorillonite platelet may be methyl, tallow, bis-2-hydroxyethyl, quaternary ammonium, with the tallow being about 65% C18, about 30% C16, and about 5% C14. In one embodiment, less than about 10% of the montmorillonite platelet is about 2 micrometers. In one embodiment, less than about 50% of the montmorillonite platelet is about 6 micrometers. In one embodiment, less than about 90% of the montmorillonite platelet is about 13 micrometers. An exemplary montmorillonite platelet may be an additive having a loose bulk density of about 14.25 lbs/ft$^3$, a packed bulk density of about 22.71 lbs/ft$^3$, and a density of about 1.98 g/cc, available from Southern Clay Products. Other suitable montmorillonite platelets preventing moisture and/or oxygen permeability may be used. For example, montmorillonite platelets having an aspect ratio of average diameter to average length of about 1.5 to about 20 may be used. Other montmorillonites that may be used include, but are not limited to, foliated talc, carbon nanofiber, smectite, and/or combinations thereof.

The light stabilizer of UV-curable coating 108 may be a liquid-hindered amine light stabilizer. The light stabilizer may provide protection against gloss reduction, cracking, blistering, delamination, and/or color change thereby extending the life of the coating. In an exemplary embodiment, the light stabilizer may form about 0.3% (by weight) to about 0.7% of the uncured UV-curable coating 108. In a further embodiment, the light stabilizer may form about 0.4% to about 0.6% of the uncured UV-curable coating 108. In a further embodiment, the light stabilizer may form about 0.5% of the uncured UV-curable coating 108. An exemplary light stabilizer may be a slightly yellow liquid, has a dynamic viscosity of 400 cps at 20° C., is more than 50% miscible with most commonly used paint solvents at 20° C., has a water solubility of less than 0.01% at 20° C., and is available from Ciba-Geigy. The exemplary light stabilizer includes two active ingredients: Bis(1,2,2,6,6-pentamethyl-4-piperidyl) sebacate (having a molecular weight of about 509) and methyl 1,2,2,6,6-pentamethyl-4-piperidyl sebacate (having a molecular weight of about 370).

The UV absorber may be a liquid hydroxyphenyl-triazine UV absorber for absorbing solar radiation of one or more predetermined wavelength ranges. The UV absorber may reduce or eliminate migration based upon the hydroxy functionality and/or may have longer performance based upon high photostability. The UV absorber may retard gloss reduction, delamination, cracking and/or blistering thereby enhancing protecting effects of UV-curable coating 108.

The UV absorber may convert radiation of a predetermined wavelength, here ultraviolet wavelength, into heat energy which can dissipate through UV-curable coating 108 without resulting in damage to the photovoltaic device. The UV absorber may permit radiation of one or more predetermined ranges to be transmitted through UV-curable coating 108. In one embodiment, the UV absorber is selected to permit transmission of radiation at one or more predetermined ranges of wavelengths corresponding to ranges of wavelengths having peak response for a predetermined photoinitiator. The UV absorber may be a nonparticle $TiO_2$ (available from Kimera), a benzotriazole, and/or hydroxyphenyl-s-triazines.

In an exemplary embodiment, the UV absorber may form about 0.3% to about 0.7% (by weight) of the uncured UV-curable coating 108. In a further embodiment, the UV absorber may form about 0.4% to about 0.6% of the uncured UV-curable coating 108. In a further embodiment, the UV absorber may form about 0.5% of the uncured UV-curable coating 108. An exemplary UV absorber may be a liquid of about 85% of active substance in 1-methoxy-2-propanol, may be viscous and slightly yellow to yellow, may be miscible with most organic solvents, may be substantially immiscible with water, may have a density of about 1.07 $g/cm^3$, and may be available from Ciba-Geigy. The exemplary UV absorber may have a transmittance spectrum with a range of low transmittance extending from about 290 nanometers to about 350 nanometers, a range of increasing transmittance extending from about 350 nanometers to about 380 nanometers, and a range of high transmittance extending from about 380 nanometers and higher. The active substance of the exemplary embodiment may be a mixture of 2-[4-[(2-Hydroxy-3-dodecyloxypropyl)oxy]-2-hydroxyphenyl]-4,6-bis(2,4-dimethylphenyl)-1,3,5-triazine and 2-[4-[(2-Hydroxy-3-tridecyloxypropyl)oxy]-2-hydroxyphenyl]-4,6-bis(2,4-dimethylphenyl)-1,3,5-triazine having an approximated combined molecular weight of about 647.

The photoinitiator of UV-curable coating 108 may be a liquid mixture for photopolymerization at one or more predetermined wavelengths in a UV curing reaction. UV curing reactions can be induced by the absorption by the photoinitiator of the one or more predetermined wavelengths (generally, in the UV range) and the resulting free radical polymerization and crosslinking of resin. The photoinitiator may be any suitable compound that absorbs radiation at the one or more predetermined wavelengths thereby being raised to an excited state. From the excited state, the photoinitiator photolyzes or degrades directly or indirectly into free radicals. The free radicals may initiate the rapid polymerization of UV-curable coating 108.

The photoinitiator may be any suitable material that generates free radicals upon exposure to radiation in the one or more predetermined wavelengths and includes, for example, bisaryl phosphine oxides, benzylic ketones and derivatives thereof, benzophenones and derivatives thereof, and mixtures thereof. In one embodiment, a synergist (for example, tertiary amines, acylated tertiary amines, and/or alkoxylated acrylate monomers) may be added to UV-curable coating 108 to facilitate free radical generation of the photoinitiator.

The photoinitiator may be selected based upon a peak response to radiation in the UV range corresponding to the curing source. For example, to correspond with a UV light emitting strongly in the range of about 380 nanometers to about 450 nanometers, a photoinitiator having peak response from a range of about 380 nanometers to about 450 nanometers may be selected.

The photoinitiator may permit low curing odor, improved color stability, and/or a balance between speed of cure and depth of cure. In an exemplary embodiment, the photoinitiator may form about 0.5% (by weight) to about 5.0% of the uncured UV-curable coating 108. In a further embodiment, the photoinitiator may form about 2.5% to about 3.5% of the uncured UV-curable coating 108. In a further embodiment, the photoinitiator may form about 3.0% of the uncured UV-curable coating 108. An exemplary photoinitiator may be a yellow viscous liquid, substantially insoluble in water, and soluble in most organic solvents, monomers, and prepolymers, and compatible with most resins, available from Lamberti. The exemplary photoinitiator may have two components: oligo[2-hydroxy-2-methyl-1-[4-(1-methylvinyl)phenyl]propanone] (at about 70%) and 2-hydroxy-2-methyl-1-phenyl propan-1-one (at about 30%). The exemplary photoinitiator may have a transmittance spectrum with a range of low transmittance extending from about 200 nanometers to about 300 nanometers, a range of increasing transmittance extending from about 300 nanometers to about 380 nanometers, and a range of high transmittance extending from about 380 nanometers and higher.

UV curing of UV-curable coating 108 may be performed by any suitable radiation source providing suitably intense enough radiation within a range of wavelengths permitting radical polymerization through excitement of the photoinitiator(s). In one embodiment, UV curing may be performed by a quartz tube with a small quantity of mercury being powered by microwave radiation, thereby vaporizing the mercury and converting the mercury into plasma to emit radiation within the range of wavelengths that excites the photoinitiator(s). Additionally or alternatively, UV curing may be performed by a quartz tube with a small quantity of mercury doped with gallium thereby permitting a deeper cure. Such "mercury lamps" or "H bulbs" and/or "gallium lamps" or "V bulbs" may include an increased range of energy between about 400 nanometers and about 450 nanometers. Other suitable UV curing systems may be used for other ranges of wavelengths or other suitable process control adjustments (for example, adjusting distance, reflector material/reflectivity, and/or focal points of the bulbs). Bulbs of various types may be used within for UV curing to achieve different depth(s) of cure, to react with different photoinitiators, and/or to control energy consumption.

EXAMPLES

A coated acrylic film according to the present disclosure was prepared having the composition set forth in Table 1.

TABLE 1

| Acrylic film (polymethylmethacrylate) - .003 ± .001 UV-cured coating - .003 ± .001 | |
|---|---|
| Material | Approximate Weight % |
| Urethane acrylate blend | 91% |
| Montmorillonite platelet | 5.0% |
| Light stabilizer | 0.5% |
| UV absorber | 0.5% |
| Photoinitiator | 3.0% |

The urethane acrylate blend was loaded with the montmorillonite platelet and mixed until the montmorillonite platelet was dispersed. The light stabilizer was then added to the solution and mixed until the light stabilizer was dispersed. The UV absorber was then added to the solution and mixed until the UV absorber was dispersed. The photoinitiator was then added to the solution and mixed until the photoinitiator was dispersed to form the UV-curable coating. The UV-curable coating was stored in an opaque container substantially devoid of light.

The UV-curable coating was then applied to the acrylic coating by a draw-down bar (applied at about 1 mil) to mimic roll coating and cured by "V" and "H" bulbs from Fusion UV Systems. Water Vapor Transmission (WVTR) testing was performed on the coated acrylic film of Example 1. The WVTR results were about 21 g/m² per 24 hours.

Another coated acrylic film according to the present disclosure was prepared having the composition set forth in Table 2.

TABLE 2

| Material | Approximate Weight % |
|---|---|
| UV-cured coating - .003 ± .001 | |
| Urethane acrylate blend | 91% |
| Montmorillonite platelet | 5.0% |
| Light stabilizer | 0.5% |
| UV absorber | 0.5% |
| Photoinitiator | 3.0% |
| Acrylic film (polymethylmethacrylate) - .003 ± .001 | |
| UV-cured coating - .003 ± .001 | |
| Urethane acrylate blend | 91% |
| Montmorillonite platelet | 5.0% |
| Light stabilizer | 0.5% |
| UV absorber | 0.5% |
| Photoinitiator | 3.0% |

The urethane acrylate blend was loaded with the montmorillonite platelet and mixed until the montmorillonite platelet was dispersed. The light stabilizer was then added to the solution and mixed until the light stabilizer was dispersed. The UV absorber was then added to the solution and mixed until the UV absorber was dispersed. The photoinitiator was then added to the solution and mixed until the photoinitiator was dispersed to form the UV-curable coating. The UV-curable coating was stored in an opaque container substantially devoid of light.

The UV-curable coating was then applied to one side of the acrylic coating by a draw-down bar (applied at 1 mil) to mimic roll coating and cured by "V" and "H" bulbs from Fusion UV Systems. The UV-curable coating was then applied to the other side of the acrylic coating by a draw-down bar (applied at 1 mil) to mimic roll coating and cured by "V" and "H" bulbs from Fusion UV Systems. Water Vapor Transmission (WVTR) testing was performed on the coated acrylic film of Example 1. The WVTR results were about 11 g/m² per 24 hours.

While the disclosure has been described with reference to a preferred embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A photovoltaic system, the photovoltaic system comprising:
   an acrylic film coated with a UV-curable coating, the UV-curable coating comprising:
     a urethane acrylate blend;
     a montmorillonite platelet;
     a light stabilizer;
     a UV absorber;
     a photoinitiator; and,
   wherein the coating is substantially transparent to visible and near infrared light, provides a barrier to oxygen and moisture, and adheres to the acrylic film;
   a securing mechanism; and
   a photovoltaic device; and,
   wherein the securing mechanism secures the acrylic film to the photovoltaic device.

2. The system of claim 1, wherein:
   the substantial transparency of the coating is above about 92% transmittance,
   the urethane acrylate blend comprises aliphatic urethane acrylate oligomer and 1,6 hexanediol diacrylate,
   the montmorillonite platelet comprises methyl, tallow, bis-2-hydroxyethyl, quaternary ammonium, the tallow being about 65% C18, about 30% C16, and about 5% C14,
   the light stabilizer comprises Bis(1,2,2,6,6-pentamethyl-4-piperidyl) sebacate and methyl 1,2,2,6,6-pentamethyl-4-piperidyl sebacate,
   the UV absorber comprises 2-[4-[(2-Hydroxy-3-dodecyloxypropyl)oxy]-2-hydroxyphenyl]-4,6-bis(2,4-dimethylphenyl)-1,3,5-triazine and 2-[4-[(2-Hydroxy-3-tridecyloxypropyl)oxy]-2-hydroxyphenyl]-4,6-bis(2,4-dimethylphenyl)-1,3,5-triazine,
   the photoinitiator comprises oligo[2-hydroxy-2-methyl-1-[4-(1-methylvinyl)phenyl]propanone] and 2-hydroxy-2-methyl-1-phenyl propan-1-one, and
   the acrylic film comprises polymethylmethacrylate.

3. The system of claim 1, wherein the securing mechanism comprises an optically transparent adhesive.

4. The system of claim 1, wherein the photovoltaic device comprises a semiconductor material selected from the group consisting of silicon, cadmium sulfide, cadmium telluride, gallium arsenide, and combinations thereof.

5. The system of claim 1, wherein the UV absorber permits radiation of one or more predetermined ranges of wavelengths to transmit through the UV-curable coating.

6. The system of claim 5, wherein the one or more predetermined ranges of wavelengths corresponding to ranges of wavelengths having peak response for a predetermined photoinitiator.

7. The system of claim 1, wherein the photoinitiator includes a peak response to radiation in the UV range.

8. The system of claim 1, wherein:
   the photoinitiator includes a transmittance spectrum with a range of low transmittance extending from about 200 nanometers to about 300 nanometers, a range of increasing transmittance extending from about 300 nanometers to about 380 nanometers, and a range of high transmittance extending from about 380 nanometers and higher; and
   the UV absorber includes a transmittance spectrum with a range of low transmittance extending from about 290 nanometers to about 350 nanometers, a range of increasing transmittance extending from about 350 nanometers to about 380 nanometers, and a range of high transmittance extending from about 380 nanometers and higher.

9. The system of claim 1, wherein the acrylic film includes a transmission versus wavelength plot including a low transmission region, an increasing transmission region, and a high transmission region, wherein the increasing transmission region of the transmission versus wavelength plot for the acrylic film extends from about 370 nanometers to about 430 nanometers.

10. The system of claim 1, further comprising a second UV-curable coating applied to an opposing side of the acrylic film.

11. The system of claim 1, wherein:
the urethane acrylate blend forms about 91% of the coating, the montmorillonite platelet forms about 5% of the coating, the light stabilizer forms about 0.5% of the coating, the UV absorber forms about 0.5% of the coating, and the photoinitiator forms about 3% of the coating.

12. A method of generating energy through photovoltaics, the method comprising:
providing a photovoltaic system, the photovoltaic system comprising:
an acrylic film coated with a UV-curable coating, the UV-curable coating comprising:
a urethane acrylate blend;
a montmorillonite platelet;
a light stabilizer;
a UV absorber;
a photoinitiator; and,
wherein the coating is substantially transparent to visible and near infrared light, provides a barrier to oxygen and moisture, and adheres to the acrylic film;
a securing mechanism; and
a photovoltaic device; and,
wherein the securing mechanism secures the acrylic film to the photovoltaic device,
positioning the photovoltaic system to receive solar radiation; and
converting the solar radiation into mechanical energy.

13. A UV-curable coating for photovoltaics, the coating comprising:
a urethane acrylate blend;
a montmorillonite platelet;
a light stabilizer;
a UV absorber;
a photoinitiator; and,
wherein the coating is substantially transparent to visible and near infrared light, provides a barrier to oxygen and moisture, and adheres to an acrylic film.

14. The coating of claim 13, wherein the substantial transparency of the coating is above about 92% transmittance.

15. The coating of claim 13, wherein the urethane acrylate blend comprises aliphatic urethane acrylate oligomer and 1,6 hexanediol diacrylate.

16. The coating of claim 13, wherein the montmorillonite platelet comprises methyl, tallow, bis-2-hydroxyethyl, quaternary ammonium, wherein the tallow is about 65% C18, about 30% C16, and about 5% C14.

17. The coating of claim 13, wherein the light stabilizer comprises Bis (1,2,2,6,6-pentamethyl-4-piperidyl) sebacate and methyl 1,2,2,6,6-pentamethyl-4-piperidyl sebacate.

18. The coating of claim 13, wherein the UV absorber comprises 2-[4-[(2-Hydroxy-3-dodecyloxypropyl)oxy]-2-hydroxyphenyl]-4,6-bis(2,4dimethylphenyl)-1,3,5- triazine and 2-[4-[(2-Hydroxy-3-tridecyloxypropyl)oxy]-2-hydroxyphenyl]-4,6-bis(2,4- dimethylphenyl)-1,3,5-triazine.

19. The coating of claim 13, wherein the photoinitiator comprises oligo[2-hydroxy-2-methyl-1-[4-(1-methylvinyl)phenyl]propanone]and 2-hydroxy-2-methyl-1-phenyl propan-1-one.

20. The coating of claim 13, wherein the acrylic film comprises polymethylmethacrylate.

* * * * *